United States Patent
Ebe et al.

(10) Patent No.: US 7,648,848 B2
(45) Date of Patent: Jan. 19, 2010

(54) SEMICONDUCTOR INTEGRATED CIRCUIT PRODUCTION METHOD AND DEVICE INCLUDING PREPARING A PLURALITY OF SOI SUBSTRATES, GROUPING SOI SUBSTRATES HAVING MUTUAL SIMILARITIES AND ADJUSTING THEIR LAYER THICKNESSES SIMULTANEOUSLY

(75) Inventors: Michihiro Ebe, Miyagi (JP); Masao Okihara, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 22 days.

(21) Appl. No.: 12/073,493

(22) Filed: Mar. 6, 2008

(65) Prior Publication Data
US 2008/0233664 A1    Sep. 25, 2008

(30) Foreign Application Priority Data
Mar. 20, 2007    (JP)    ............................. 2007-072481

(51) Int. Cl.
*H01L 21/66*    (2006.01)
*H01L 21/00*    (2006.01)
*H01L 21/84*    (2006.01)
*H01L 21/302*    (2006.01)
*H01L 21/461*    (2006.01)

(52) U.S. Cl. .......................... 438/14; 438/149; 438/756
(58) Field of Classification Search .................. 438/14, 438/149, 756; 257/E27.112
See application file for complete search history.

(56) References Cited

U.S. PATENT DOCUMENTS

| | | | | |
|---|---|---|---|---|
| 6,875,656 | B2 * | 4/2005 | Barna | 438/269 |
| 2005/0209723 | A1 * | 9/2005 | Cosci et al. | 700/108 |

FOREIGN PATENT DOCUMENTS

| JP | 63-249328 | 10/1988 |
|---|---|---|
| JP | 04-239152 | 8/1992 |
| JP | 05-073578 | 3/1993 |
| JP | 07-302826 | 11/1995 |
| JP | 2004-22839 | 1/2004 |
| JP | 2006-253584 | 9/2006 |

* cited by examiner

*Primary Examiner*—William M. Brewster
(74) *Attorney, Agent, or Firm*—Rabin & Berdo, PC

(57) ABSTRACT

A semiconductor integrated circuit production method prepares an SOI layer thickness database that correlates measurement data of each SOI layer thickness with each SOI substrate identification data. The production method extracts the measurement data for each SOI substrate from the SOI layer thickness database, and carries out layer thickness adjustment surface treatment for the SOI substrates based on these data. A semiconductor integrated circuit production device includes an SOI layer thickness database storage unit for storing the SOI layer thickness database, and a layer thickness adjustment conditions control unit for extracting the measurement data for each SOI substrate from the SOI layer thickness database and deciding conditions for the layer thickness adjustment surface treatment based on these data. The semiconductor integrated circuit production device also includes a surface treatment unit that adjusts SOI layer thickness by carrying out the surface treatment on the SOI layers in accordance with the decided conditions.

14 Claims, 15 Drawing Sheets

FIG. 8

| PRODUCTION LOT NUMBER | SOI SUBSTRATE NUMBER | SOI LAYER THICKNESS VALUES | | | | | LOT MEAN VALUE |
|---|---|---|---|---|---|---|---|
| | | MAXIMUM VALUE | MINIMUM VALUE | VARIATION | MEAN VALUE | | |
| L1 | L1-1 | 99.5 | 96.5 | 3 | 98 | | 102.0 |
| L1 | L1-2 | 106.75 | 105.25 | 1.5 | 106 | | |
| L1 | L1-3 | 104 | 100 | 4 | 102 | | |
| L2 | L2-1 | 100 | 98 | 2 | 99 | | 99.0 |
| L2 | L2-2 | 102.75 | 99.25 | 3.5 | 101 | | |
| L2 | L2-3 | 98.75 | 95.25 | 3.5 | 97 | | |
| L3 | L3-1 | 103.75 | 102.25 | 1.5 | 103 | | 100.7 |
| L3 | L3-2 | 102.25 | 99.75 | 2.5 | 101 | | |
| L3 | L3-3 | 99.5 | 96.5 | 3 | 98 | | |
| ..... | ..... | ..... | ..... | ..... | ..... | | ..... |

FIG. 9

| SOI SUBSTRATE GROUP | PRODUCTION LOT NUMBER | SOI SUBSTRATE NUMBER | SOI LAYER THICKNESS VALUES | | | | | LOT MEAN VALUE |
|---|---|---|---|---|---|---|---|---|
| | | | MAXIMUM VALUE | MINIMUM VALUE | VARIATION | MEAN VALUE | | |
| G1 | L1 | L1-1 | 99.5 | 96.5 | 3 | 98 | | 102.0 |
| | L1 | L1-2 | 106.75 | 105.25 | 1.5 | 106 | | |
| | L1 | L1-3 | 104 | 100 | 4 | 102 | | |
| | L3 | L3-1 | 103.75 | 102.25 | 1.5 | 103 | | 100.7 |
| | L3 | L3-2 | 102.25 | 99.75 | 2.5 | 101 | | |
| | L3 | L3-3 | 99.5 | 96.5 | 3 | 98 | | |
| | .... | .... | .... | .... | .... | .... | | .... |
| G2 | L2 | L2-1 | 100 | 98 | 2 | 99 | | 99.0 |
| | L2 | L2-2 | 102.75 | 99.25 | 3.5 | 101 | | |
| | L2 | L2-3 | 98.75 | 95.25 | 3.5 | 97 | | |
| | .... | .... | .... | .... | .... | .... | | .... |

FIG. 10

| SOI SUBSTRATE GROUP | PRODUCTION LOT NUMBER | SOI SUBSTRATE NUMBER | SOI LAYER THICKNESS VALUES ||||
|---|---|---|---|---|---|---|
| | | | MAXIMUM VALUE | MINIMUM VALUE | VARIATION | MEAN VALUE |
| G1 | L1 | L1-2 | 106.75 | 105.25 | 1.5 | 106 |
| | L3 | L3-1 | 103.75 | 102.25 | 1.5 | 103 |
| | L1 | L1-3 | 104 | 100 | 4 | 102 |
| | L2 | L2-2 | 102.75 | 99.25 | 3.5 | 101 |
| | L3 | L3-2 | 102.25 | 99.75 | 2.5 | 101 |
| | .... | .... | .... | .... | .... | .... |
| G2 | L2 | L2-1 | 100 | 98 | 2 | 99 |
| | L1 | L1-1 | 99.5 | 96.5 | 3 | 98 |
| | L3 | L3-3 | 99.5 | 96.5 | 3 | 98 |
| | L2 | L2-3 | 98.75 | 95.25 | 3.5 | 97 |
| | .... | .... | .... | .... | .... | .... |

FIG. 11

| SOI SUBSTRATE GROUP | PRODUCTION LOT NUMBER | SOI SUBSTRATE NUMBER | SOI LAYER THICKNESS VALUES | | | |
|---|---|---|---|---|---|---|
| | | | MAXIMUM VALUE | MINIMUM VALUE | VARIATION | MEAN VALUE |
| G1 | L1 | L1-2 | 106.75 | 105.25 | 1.5 | 106 |
| | L3 | L3-1 | 103.75 | 102.25 | 1.5 | 103 |
| | .... | .... | .... | .... | .... | .... |
| G2 | L2 | L2-1 | 100 | 98 | 2 | 99 |
| | .... | .... | .... | .... | .... | .... |
| G3 | L1 | L1-3 | 104 | 100 | 4 | 102 |
| | L2 | L2-2 | 102.75 | 99.25 | 3.5 | 101 |
| | L2 | L2-3 | 98.75 | 95.25 | 3.5 | 97 |
| | L1 | L1-1 | 99.5 | 96.5 | 3 | 98 |
| | L3 | L3-3 | 99.5 | 96.5 | 3 | 98 |
| | L3 | L3-2 | 102.25 | 99.75 | 2.5 | 101 |
| | .... | .... | .... | .... | .... | .... |

FIG. 12

| SOI SUBSTRATE GROUP | TEMPERATURE (°C) | TIME (min) | ATMOSPHERE |
|---|---|---|---|
| G1 | 880 | 120 | X |
| G2 | 800 | 100 | Y |

SEMICONDUCTOR INTEGRATED CIRCUIT PRODUCTION METHOD AND DEVICE INCLUDING PREPARING A PLURALITY OF SOI SUBSTRATES, GROUPING SOI SUBSTRATES HAVING MUTUAL SIMILARITIES AND ADJUSTING THEIR LAYER THICKNESSES SIMULTANEOUSLY

BACKGROUND OF THE INVENTION

1. Field of the Invention

The present invention relates to a method of manufacturing a semiconductor integrated circuit, and more particularly, to a method and apparatus for manufacturing a fully-depleted (FD) silicon-on-insulator (SOI) CMOS device.

2. Description of the Related Art

Attention has recently been focused on silicon-on-insulator (SOI) technology from the viewpoint of improving transistor performance and efficiency. In the case of ordinary bulk CMOS, a transistor is formed on a silicon substrate. In the case of SOI CMOS, on the other hand, a transistor is formed on an SOI substrate having an insulator between the silicon substrate and a device region. Consequently, SOI CMOS have advantages such as lower power consumption due to reduction of parasitic capacitance and decreased leakage current as well as faster operation as a result of reduced junction capacitance in comparison with bulk CMOS.

A gate of SOI CMOS is formed on a silicon thin film formed on an insulator, and SOI CMOS is classified to two groups based on the thickness of the silicon thin film (referred to as an SOI layer). One group is a partially-depleted SOI (PD-SOI) and the other group is a fully-depleted SOI (FD-SOI). Normally, in the case of FD-SOI, the thickness of the SOI layer is about 50 nm or less when a design rule of about 0.2 μm is employed. If the thickness of the SOI layer is greater than 50 nm, the SOI CMOS becomes a PD-SOI due to the formation of a neutral region in the channel region of the transistor. An FD-SOI obtained by reducing the thickness of the SOI layer can reduce the gate voltage value (S value) in the subthreshold region as compared with PD-SOI, and has advantages (namely, faster operation and low current consumption) because of reduced off-leakage voltage and lowered Vt value (lower threshold voltage value).

If the thickness of the SOI layer is improper, the characteristics of FD-SOI are impaired. If the SOI layer is excessively thick, a PD-SOI results instead of an FD-SOI due to the formation of a neutral region in the channel region of the transistor. On the other hand, if the SOI layer is excessively thin and cobalt silicide ($CoSi_2$) is formed in the source region and drain region composed of the SOI layer, it reacts with Si and Co in the channel and causes leakage.

Substrates for semiconductor integrated circuit production are often controlled and manufactured in production lot units. One example of a technology for controlling and manufacturing in production lot units is disclosed in Japanese Patent Application Kokai (Laid-open) No. H5-73578. This Japanese Patent Application describes a lot control device in which a single production lot is divided into a plurality of lot units, each lot is assigned an individual lot number at the time of that division, and the divided lots are rejoined to the single (original) production lot using the assigned lot numbers after having gone through some steps. Japanese Patent Application Kokai No. H4-239152 discloses a lot compilation method and device in which an optically-readable (scannable) identification code is imparted to the surface of each substrate in advance, the identification code of each substrate is scanned at the time of lot compilation, and lots are compiled based on the scanned identification codes.

Japanese Patent Application Kokai No. H7-302826 discloses a process for implanting impurities into a source and drain, measuring actual implantation depth and then altering gate length based on the measured implantation depth and a predetermined equation if the measured implantation depth is different from a desired depth.

Japanese Patent Application Kokai No. S63-249328 discloses technology relating to systemization of a semiconductor production line by inspecting semiconductor chips during the course of production, simulating operation and characteristics of an ultimate product (semiconductor device) using results obtained from the inspection and processing conditions of the next step, and then optimizing processing conditions of the next step for semiconductor chips currently being produced, based on the simulation results.

If there are variations in SOI layer thickness among a plurality of delivered SOI substrates, the technologies disclosed in Japanese Patent Applications Kokai No. H5-73578, No. H4-239152, No. H7-302826 and No. S63-249328 do not allow the production of FD-SOI of uniform quality.

In Japanese Patent Application Kokai No. H5-73578, SOI substrates are divided into a plurality of lot units irregardless of SOI layer thickness and lot numbers are assigned to the respective lots. Thus, there are variations in SOI layer thickness among the SOI substrates contained in each individual lot. Fixed process conditions are used for all substrates in a single lot. If semiconductor integrated circuits are manufactured in lot units, FD-SOI of uniform quality are unable to be produced.

In the lot compilation method and device disclosed in Japanese Patent Application Kokai No. H4-239152, lots are recompiled based on identification numbers imparted to the respective substrates in advance regardless of SOI layer thickness. Therefore, there are variations in SOI layer thickness among the SOI substrates contained within the same lot. If semiconductor integrated circuits are manufactured en bloc in such lot units containing a plurality of SOI substrates having variations in the SOI layer thickness, FD-SOI of uniform quality are unable to be produced.

In the example described in Japanese Patent Application Kokai No. H7-302826, actual implantation depth is inspected following implantation of impurities into a source and drain. In the manufacturing of FD-SOI, the source and drain are formed in an SOI layer. Therefore, if there are variations in SOI layer thickness among a plurality of SOI substrates, FD-SOI of uniform quality are unable to be produced.

In the production device disclosed in Japanese Patent Application Kokai No. S63-249328, processing conditions are decided for the next step based on processing results of a certain step. Since a plurality of SOI substrates are normally processed en bloc in each step of FD-SOI production, FD-SOI of uniform quality are unable to be produced if there are variations in SOI layer thickness among a plurality of SOI substrates. Deciding the processing conditions of the next step on the basis of processing results of a certain step does not solve the problem of unequal quality.

SUMMARY OF THE INVENTION

An object of the present invention is to provide a method for producing SOI semiconductor integrated circuits of uniform characteristics and quality despite the presence of variations in SOI layer thickness in given SOI substrates.

Another object of the present invention is to provide a device for manufacturing SOI semiconductor integrated circuits of uniform characteristics and quality despite the presence of variations in SOI layer thickness in given SOI substrates.

According to one aspect of the present invention, there is provided a semiconductor integrated circuit production method that includes an SOI substrate preparation step for preparing a plurality of SOI substrates. Each SOI substrate has an SOI layer on its surface. The production method also includes a layer thickness adjustment step for adjusting the thickness of the SOI layers of the SOI substrates by carrying out a layer thickness adjustment surface treatment on the SOI layers. The production method also includes a semiconductor integrated circuit formation step for forming a semiconductor integrated circuit on the SOI layers following the surface layer adjustment. The layer thickness adjustment step includes an SOI layer thickness database generation step for generating an SOI layer thickness database that correlates identification data for each of the SOI substrates with measurement data of the thickness of each SOI layer. The layer thickness adjustment step also includes a surface treatment step for extracting measurement data for each SOI substrate from the SOI layer thickness database and carrying out layer thickness adjustment surface treatment on the SOI substrates according to treatment conditions decided based on the extracted measurement data.

According to another aspect of the present invention, there is provided a semiconductor integrated circuit production device that includes a substrate storage unit for housing a plurality of SOI substrates. Each SOI substrate has an SOI layer on its surface. The semiconductor integrated circuit production device also includes a layer thickness adjustment unit for taking the SOI substrates from the substrate storage unit and adjusting the thickness of the SOI layers of the SOI substrates. The semiconductor integrated circuit production device also includes a semiconductor integrated circuit formation unit for forming semiconductor integrated circuits on the SOI layers following the layer thickness adjustment. The layer thickness adjustment unit has an SOI layer thickness database storage unit for storing an SOI layer thickness database that correlates identification data for each of the SOI substrates with measurement data of the thickness of the SOI layers. The layer thickness adjustment unit also has a layer thickness adjustment conditions control unit for extracting the measurement data for the SOI substrates from the SOI layer thickness database and setting conditions of the layer thickness adjustment surface treatment based on the extracted data. The layer thickness adjustment unit also has a surface treatment unit for adjusting the layer thicknesses of the SOI layers by carrying out the surface treatment on the SOI layers in accordance with the set conditions.

These and other objects, aspects and advantages of the present invention will become apparent to those skilled in the art from the following detailed description and appended claims, when read and understood in conjunction with the accompanying drawings.

BRIEF DESCRIPTION OF THE DRAWINGS

FIG. 8 shows an example of an SOI layer thickness database;

FIG. 9 illustrates an example of a substrate group table based on lot mean values;

FIG. 10 illustrates an example of a substrate group table based on mean layer thickness values;

FIG. 11 illustrates an example of a substrate group table based on layer thickness variation;

FIG. 12 illustrates an example of a layer thickness adjustment surface treatment conditions table;

DETAILED DESCRIPTION OF THE INVENTION

The following provides an explanation of embodiments of the present invention with reference to the attached drawings.

Figure 1:
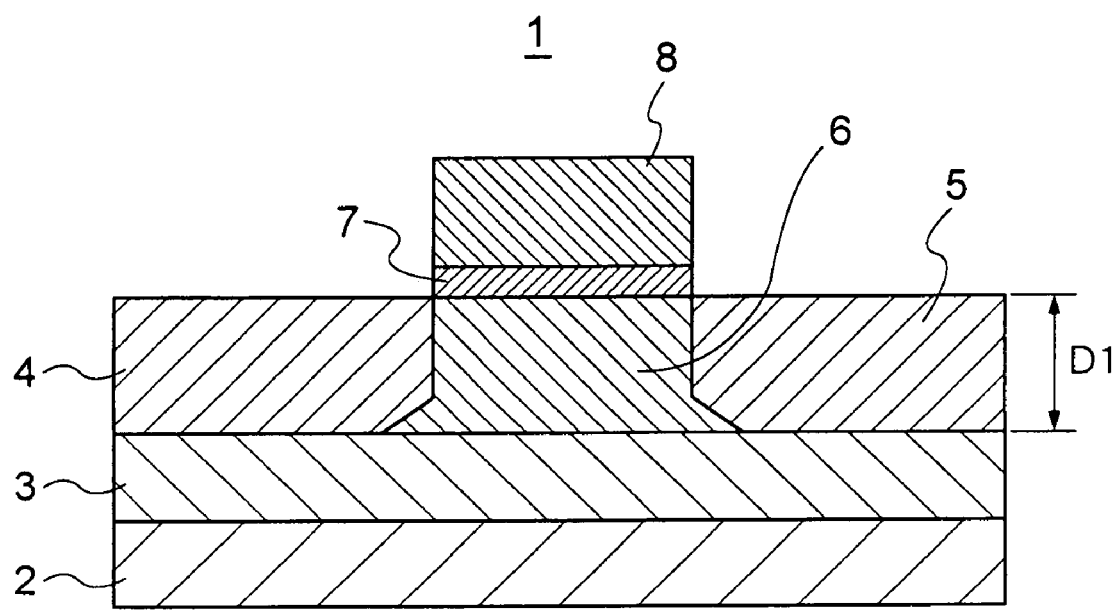
FIG. 1 is a cross-sectional view of a semiconductor integrated circuit produced with a fabrication method according to an embodiment of the present invention.
Figure 2:
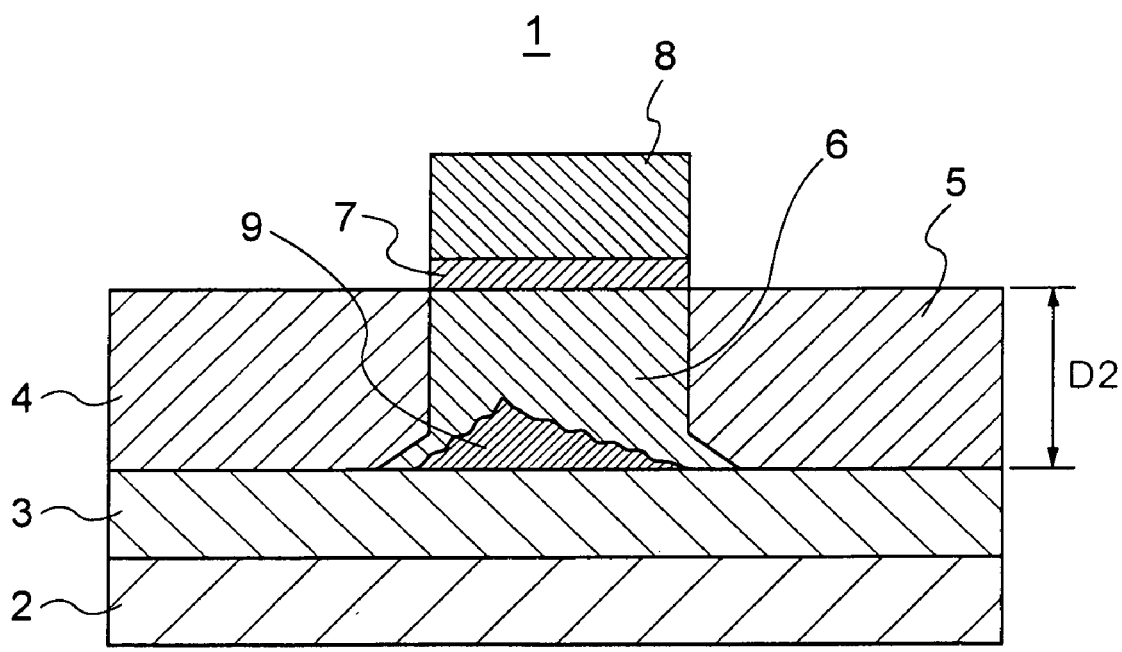
FIG. 2 is a cross-sectional view of a semiconductor integrated circuit having a thick SOI layer.
Figure 3:
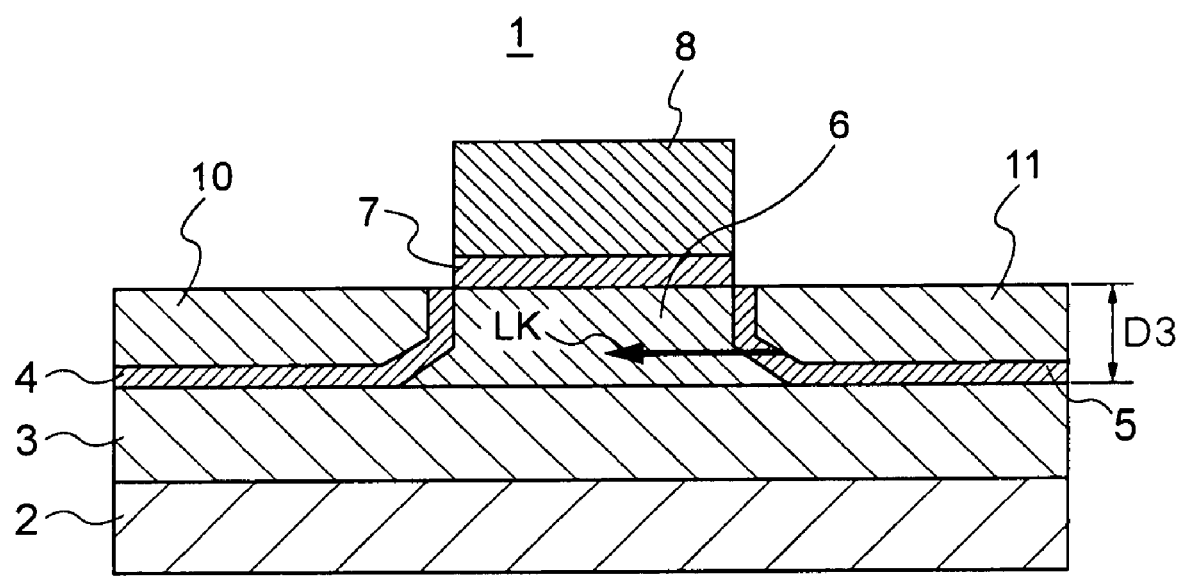
FIG. 3 is a cross-sectional view of a semiconductor integrated circuit having a thin SOI layer.

Referring to FIG. 1, a semiconductor integrated circuit 1 produced by the fabrication method according to one embodiment of the present invention will be described. This semiconductor integrated circuit 1 has an SOI structure. The semiconductor integrated circuit 1 has a silicon substrate 2, and an oxide film 3 on the silicon substrate 2. The semiconductor integrated circuit 1 also has an SOI layer on the buried oxide film 3. A source 4 and drain 5 are formed in the SOI layer. A channel region 6 is defined between the source 4 and drain 5, and a gate oxide film 7 is formed on the channel region 6. A gate 8 is formed on the gate oxide film 7. When producing FD-SOI, it is necessary that SOI layer thickness D1 be of the proper thickness. FIG. 2 shows a semiconductor integrated circuit 1 having a thick SOI layer. If an SOI layer of a comparatively thick SOI layer thickness D2 is formed on the buried oxide film 3, an intermediate region 9 is formed in the channel region 6. Thus, the produced semiconductor integrated circuit 1 ends up being a PD-SOI instead of an FD-SOI. FIG. 3 illustrates a semiconductor integrated circuit 1 having a thin SOI layer. If an SOI layer of a comparatively thin SOI layer thickness D3 is formed on the buried oxide film 3, and cobalt silicide 10 and 11 are formed on the source 4 and drain 5, then the cobalt reacts with the silicon of the channel region 6 and causes the leakage LK. Consequently, it is important that the SOI layer has the proper thickness.

Figure 4:
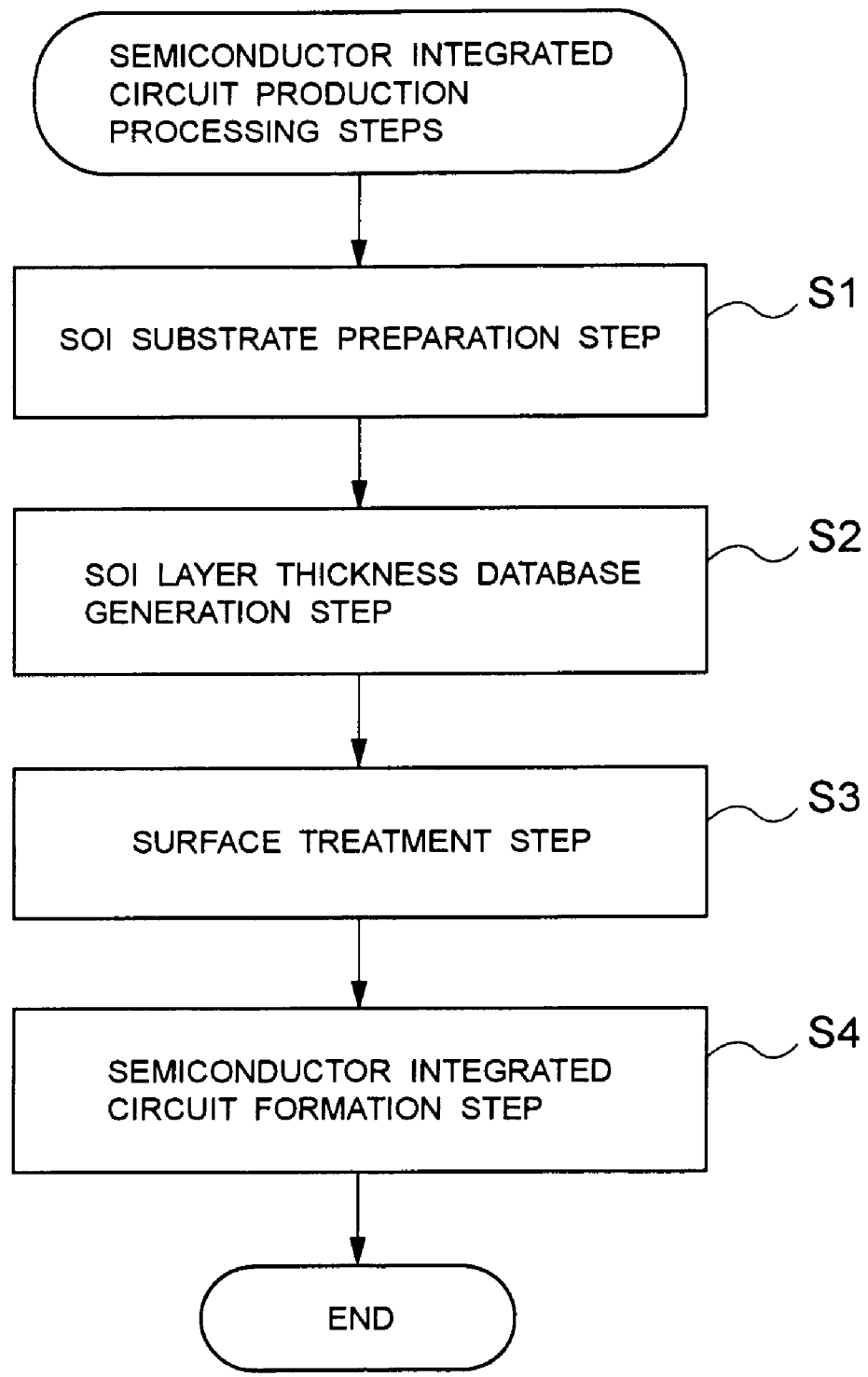
FIG. 4 is a flow chart showing the processing steps of a semiconductor integrated circuit production method according to an embodiment of the present invention.
Figure 5A:
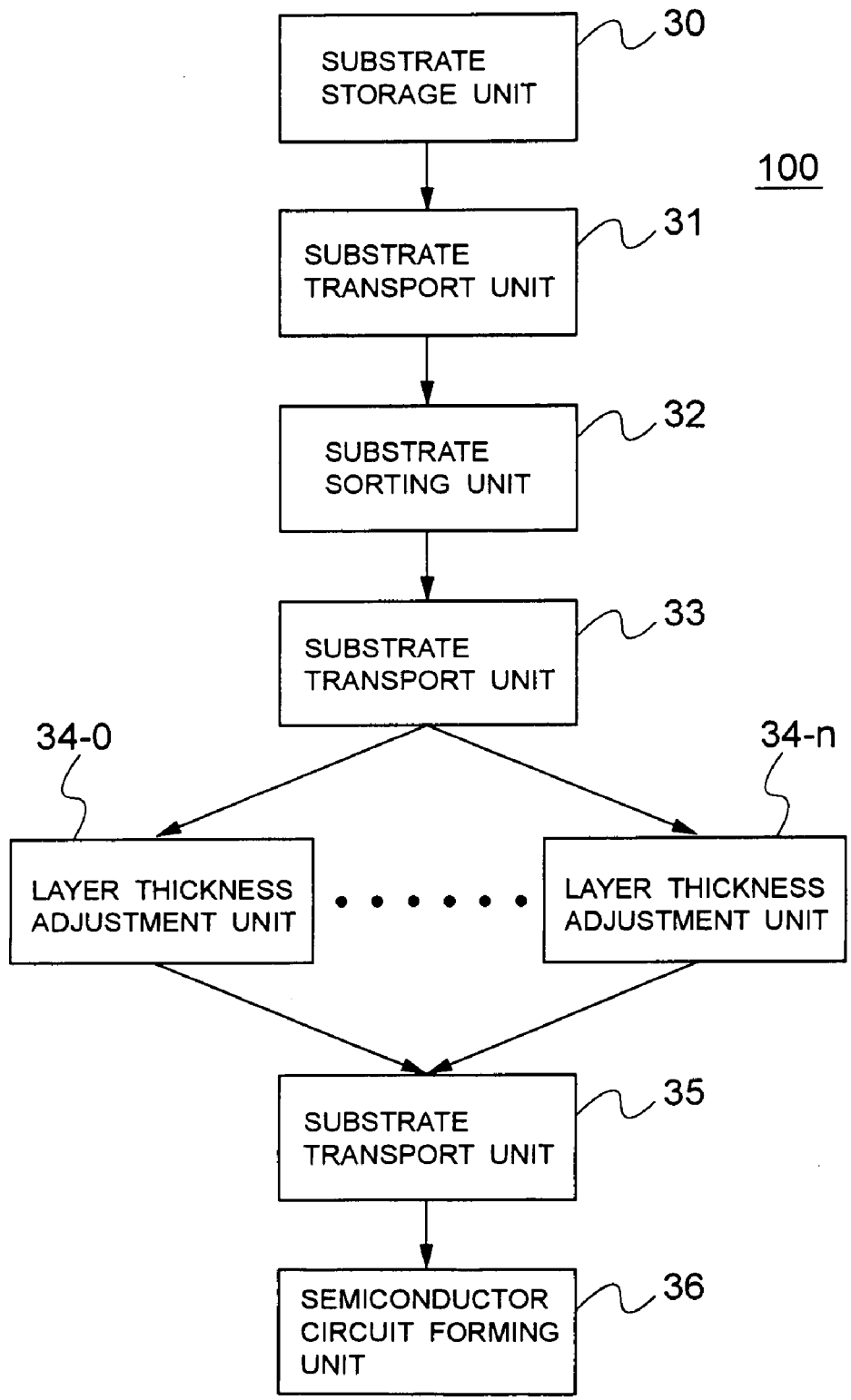
FIG. 5A is a block diagram showing a semiconductor integrated circuit production device used with the production method of FIG. 4.

FIG. 4 is a flow chart showing the processing steps of the semiconductor integrated circuit production method according to the embodiment of the present invention. FIG. 5A is a block diagram showing an arrangement 100 for fabricating a semiconductor integrated circuit. The following provides an explanation of the processing steps of the semiconductor integrated circuit production method and the semiconductor integrated circuit production device 100 while referring to FIGS. 4 and 5A.

Figure 5B:
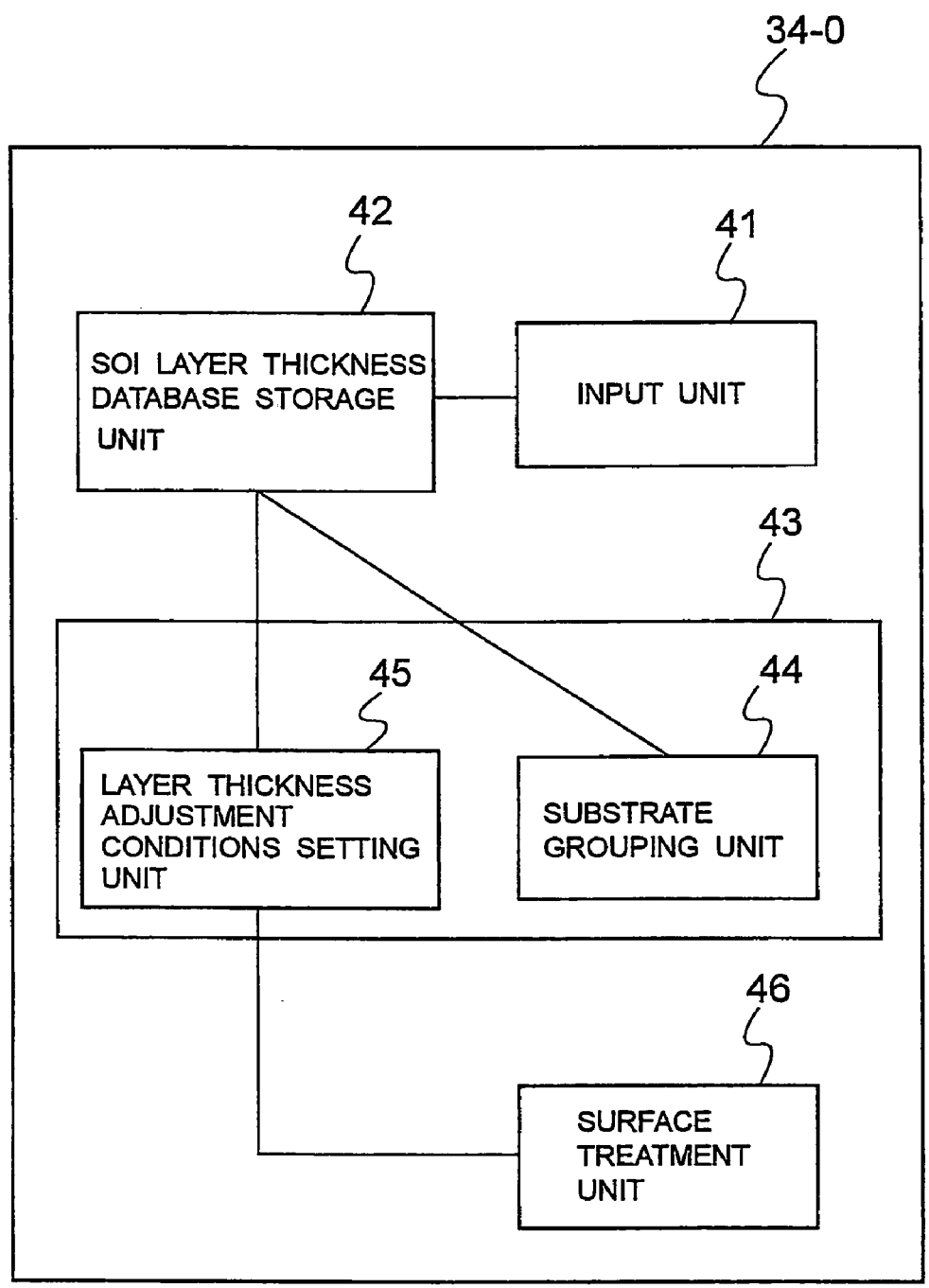
FIG. 5B is a block diagram showing a layer thickness adjustment unit of the production device shown in FIG. 5A.

The semiconductor integrated circuit production device 100 includes a substrate storage unit 30, substrate transport units 31, 33 and 35, a substrate sorting unit 32, layer thickness adjustment units 34-0 to 34-$n$ (where n is a positive integer), and a semiconductor circuit forming unit 36. FIG. 5B is a block diagram of the layer thickness adjustment unit 34-0. The layer thickness adjustment unit 34-0 includes an input unit 41, an SOI layer thickness database storage unit 42, and a layer thickness adjustment conditions control unit 43. The layer thickness adjustment conditions control unit 43 includes a substrate grouping unit 44 and a layer thickness adjustment conditions setting unit 45. Each of other layer thickness adjustment units 34-1 to 34-$n$ employs the same configuration as the layer thickness adjustment unit 34-0.

Referring first to FIG. 4, a plurality of SOI substrates are prepared in an SOI substrate preparation step (S1). Normally, SOI substrates are delivered in production lot units to a semiconductor integrated circuit production factory. Upon delivery, the substrate storage unit 30 houses a plurality of SOI substrates. Normally, the substrate storage unit 30 houses the SOI substrates in production lot units. For example, once inspection processing and the like on the SOI substrates has been completed, the substrate transport unit 31 transports the SOI substrates to the substrate sorting unit 32 in production lot units.

Figure 6:
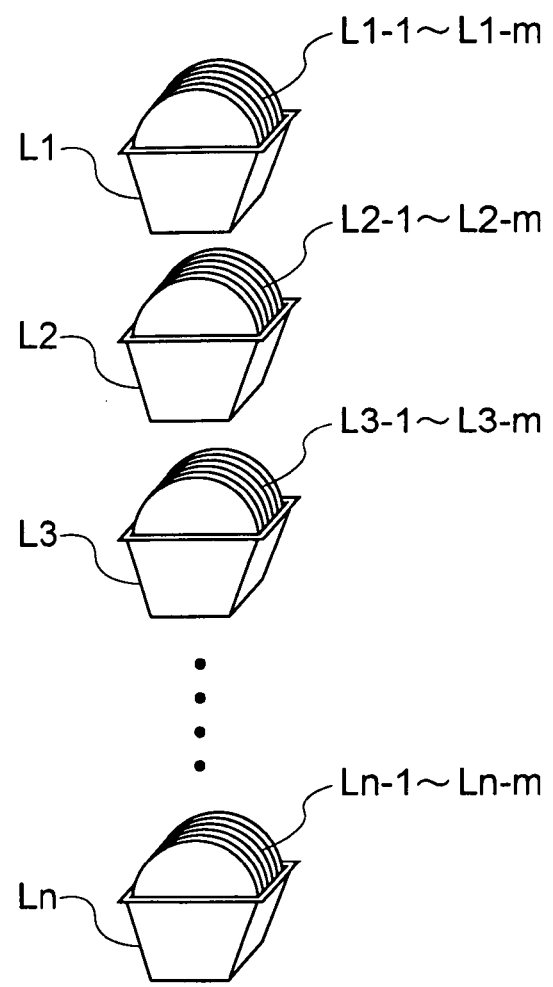
FIG. 6 depicts production lots and SOI substrates contained therein.
Figure 7:
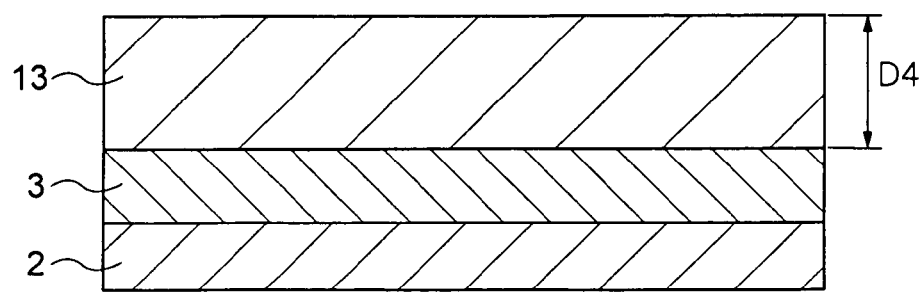
FIG. 7 is a cross-sectional view of an SOI substrate.

FIG. 6 depicts the production lots L1 to Ln and SOI substrates contained therein. The production lot L1 contains the SOI substrates L1-1 to L1-$m$ (where m is a positive integer), the production lot L2 contains the SOI substrates L2-1 to L2-$m$ and so forth, and finally the production lot Ln contains the SOI substrates Ln-1 to Ln-m. FIG. 7 is a cross-sectional view of the SOI substrate L1-1. An SOI layer 13 having an SOI layer thickness D4 is formed on the buried oxide film 3 formed on the silicon substrate 2. Each of the cross-sections of the SOI substrates L1-2 to Ln-m is the same as that of the SOI substrate L1-1.

Next, an SOI layer thickness database is generated in an SOI layer thickness database generation step (S2 in FIG. 4). This database correlates identification data for each SOI substrate with measurement data of SOI layer thickness of that SOI substrate. Normally, an administrator and the like of the semiconductor integrated circuit production device 100 correlates identification data for each SOI substrate with the measurement data of the SOI layer thickness and enters that data into the input unit 41. The input unit 41 receives the individual SOI substrate identification data and the SOI layer thickness measurement data, and supplies this data to the SOI layer thickness database storage unit 42. The SOI layer thickness database storage unit 42 then correlates the individual SOI substrate identification data and SOI layer thickness measurement data and stores the data in the SOI layer thickness database.

FIG. 8 shows an example of the SOI layer thickness database. "Production lot number" indicates the identification number of a production lot concerned. The production lot identification number is the number assigned in advance to each production lot before delivery, or a number assigned to each production lot in the SOI layer thickness database generation step S2. In this particular embodiment, the numbers L1 to L3 are assigned in advance to production lot units before delivery. "SOI substrate number" indicates the identification number of an SOI substrate. The SOI substrate identification number is a number assigned in advance to each SOI substrate before delivery, or a number assigned to each SOI substrate in the SOI layer thickness database generation step. In this embodiment, the numbers L1-1 to L3-3 are assigned in advanced to the SOI substrates prior to the delivery. "SOI layer thickness values" are stored for each parameter consisting of "maximum value", "minimum value", "variation", "mean value" and "mean lot value." The "maximum value" and "minimum value" are the maximum and minimum values of measurement data for SOI layer thickness D4 of the same SOI substrate. "Variation" is the difference between the maximum and minimum values of measurement data for SOI layer thickness D4 of the same SOI substrate. "Mean value" is the mean value of the maximum and minimum values of measurement data for SOI layer thickness D4 of the same SOI substrate. "Lot mean value" is a value obtained by averaging the "mean values" of the SOI substrates contained in the same production lot.

Measurement data prior to delivery to the factory may be used for the "SOI layer thickness values." Alternatively, measurement data obtained by measuring the SOI layer thickness D4 of each substrate after delivery may be used for the "SOI layer thickness values." The "SOI layer thickness values" may be compiled in a database in a form other than the previously listed parameters. The values in FIG.8 represent an example of the case of using a value of 100 nm for the median of SOI layer thickness, but the present invention is not limited thereto.

Next, in a surface treatment step (S3 in FIG. 4), the measurement data for each SOI substrate is extracted from the SOI layer thickness database, and layer thickness adjustment surface treatment is carried out on the SOI substrates based on that data. In this step, SOI substrates having similar measurement data are grouped (sorted), and layer thickness surface treatment is simultaneously carried out on those SOI substrates belonging to the same group.

The substrate grouping unit 44 reads the SOI layer thickness values from the SOI layer thickness database stored in the SOI layer thickness database storage unit 42, and groups the SOI substrates into a plurality of substrate groups based on the SOI layer thickness values to create a substrate group table. The following describes an example of a substrate group table.

FIG. 9 shows an example of a substrate group table based on lot mean values. This table shows the grouping on the basis of "lot mean values" of "SOI layer thickness values" in the SOI layer thickness database. In this table, substrate group numbers assigned to respective substrate groups during the grouping of the SOI substrates are indicated in the column of the "SOI substrate group." The production lots L1 and L3 having the "lot mean" of 100 nm or more are grouped into the substrate group G1, and the production lot L2 having the "lot mean" of less than 100 nm is grouped into the substrate group G2. Specifically, the SOI substrates L1-1 to L1-3 and L3-1 to L3-3 contained in the production lot numbers L1 and L3 are grouped into the substrate group G1, while the SOI substrates L2-1 to L2-3 contained in the production lot number L2 are grouped into the substrate group G2. Normally, the SOI substrates are grouped according to the production lot number when the SOI layer thickness of each production lot has a particular tendency.

FIG. 10 depicts an example of a group table prepared based on layer thickness mean values. This table shows the grouping on the basis of "mean values" of "SOI layer thickness values" in the SOI layer thickness database. In FIG. 10, the SOI substrates having an SOI layer thickness of 100 nm or more are grouped into the substrate group G1 and the SOI substrates having an SOI layer thickness of less than 100 nm are grouped into the substrate group G2. Specifically, the SOI substrates L1-2, L3-1, L1-3, L2-2 and L3-2 are grouped into the substrate group G1, while the SOI substrates L2-1, L1-1, L3-3 and L2-3 are grouped into the substrate group G2. Normally, the substrates are grouped according to layer thickness mean values if it is desired to make the layer thicknesses of all SOI substrates as uniform as possible.

FIG. 11 illustrates an example of a substrate group table based on layer thickness variation. This table shows the grouping on the basis of "variation" of "SOI layer thickness values" in the SOI layer thickness database. In this table, the SOI substrates having a variation in SOI layer thickness within the same wafer of 2 nm or more are grouped into the substrate group G3, the SOI substrates having a variation of less than 2 nm and a mean value of SOI layer thickness of 100 nm or more are grouped into the substrate group G1, and the SOI substrates having a variation of less than 2 nm and a mean value of SOI layer thickness of less than 100 nm are grouped into the substrate group G2. Specifically, the SOI substrates L1-3, L2-2, L2-3, L1-1, L3-3 and L3-2 are grouped into the substrate group G3, the SOI substrates L1-2 and L3-1 are grouped into the substrate group G1, and the SOI substrate L2-1 is grouped into the substrate group G2. Normally, the SOI substrates contained in the substrate group G3 having large variation do not undergo the SOI layer thickness adjustment and are used in devices not requiring uniform layer thickness, while the SOI substrates contained in the substrate groups G1 and G2 having small(er) variations undergo the SOI layer thickness adjustment under appropriate conditions for each group and are used in devices requiring uniform layer thickness.

It should be noted that the substrate groups described above are merely examples, and the SOI substrates may also be grouped on the basis of other criteria. In this particular embodiment, one of the above-described three substrate group tables (FIGS. 9, 10 and 11) can be selected in the surface treatment step.

Once a substrate group table has been created, the substrate grouping unit 44 supplies the substrate group table to the substrate sorting unit 32. The substrate sorting unit 32 then sorts the SOI substrates for each substrate group based on the substrate group table received from the substrate grouping unit 44.

In surface treatment step (S3 in FIG. 4), the measurement data for each SOI substrate is extracted from the SOI layer thickness database, and layer thickness adjustment surface treatment conditions are decided for the respective substrate groups based on this data. In this step, layer thickness adjustment surface treatment conditions are set for each substrate group so as to reduce variations in SOI layer thickness among the SOI substrates within each substrate group.

Once the substrate grouping unit 44 has created a substrate group table, the layer thickness adjustment conditions setting unit 45 reads SOI layer thickness values from the SOI layer thickness database stored in the SOI layer thickness database storage unit 42, and sets the layer thickness adjustment surface treatment conditions for each substrate group based on the SOI layer thickness values.

FIG. 12 shows an example of a table of layer thickness adjustment surface treatment conditions. Substrate group numbers are indicated in the column of "SOI substrate group" in this table. "Temperature" indicates the treatment temperature (degrees C.) of layer thickness adjustment surface treatment. "Time" indicates the treatment time (minute) of layer thickness adjustment surface treatment. "Atmosphere" indicates the atmospheric conditions in the chamber where the layer thickness adjustment surface treatment is carried out. The "atmospheric conditions" refer to, for example, the concentration of a gas such as oxygen, and substrate grouping is carried out in advance based on, for example, the composite ratio of the gas (X and Y in the same drawing). In the surface treatment step, layer thickness adjustment surface treatment conditions are set on the basis of predetermined conditions.

Figure 13:
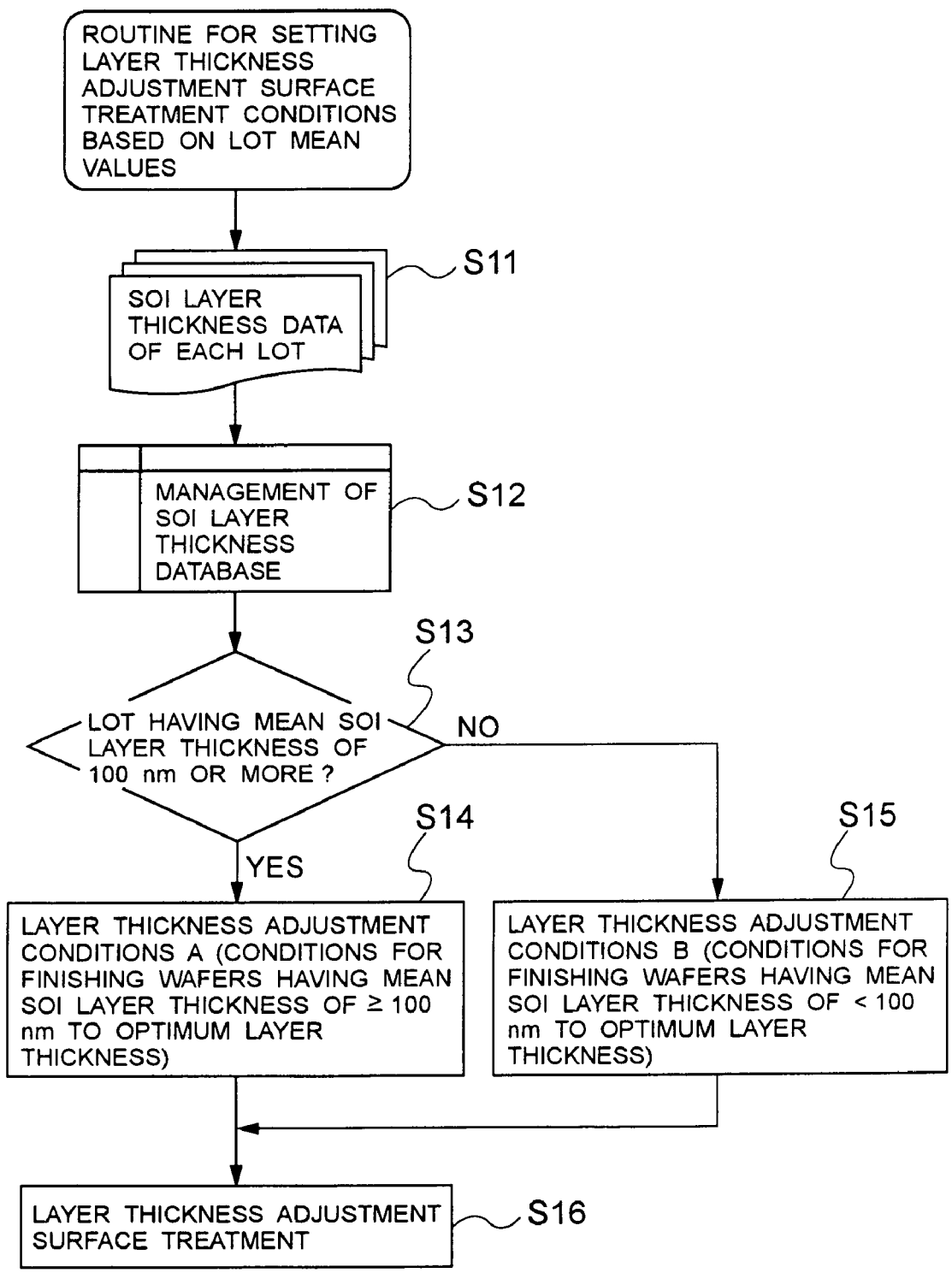
FIG. 13 is a flow chart showing a routine for setting layer thickness adjustment surface treatment conditions based on lot mean values.

FIG. 13 is a flow chart showing a routine for setting layer thickness adjustment surface treatment conditions based on lot mean values. An administrator and the like of the semiconductor integrated circuit production device correlates identification data for each SOI substrate with the measurement data of SOI layer thickness and inputs these data into the input unit 41. The input unit 41 receives the input individual SOI substrate identification data and SOI layer thickness measurement data, and supplies these data to the SOI layer thickness database storage unit 42 (S11). The SOI layer thickness database storage unit 42 then stores the database (SOI layer thickness database) of the correlated individual SOI substrate identification data and SOI layer thickness measurement data (S12). The substrate grouping unit 44 reads SOI layer thicknesses from the SOI layer thickness database stored in the SOI layer thickness database storage unit 42, and groups the SOI substrates into a plurality of substrate groups based on the SOI layer thicknesses to create a substrate group table based on lot mean values (S12). Once the substrate grouping unit 44 has created the substrate group table, the layer thickness adjustment conditions setting unit 45 reads SOI layer thicknesses from the SOI layer thickness database stored in the SOI layer thickness database storage unit 42, and sets layer thickness adjustment surface treatment conditions for each substrate group based on the SOI layer thicknesses. If the SOI layer thickness mean value within the same lot is 100 nm or more (S13), the layer thickness adjustment conditions setting unit 45 sets the layer thickness adjustment conditions A (including temperature, time and atmospheric conditions) so that substrates having an SOI layer thickness mean value of 100 nm or more are finished to an optimum layer thickness (S14). If the SOI layer thickness mean value within the same lot is less than 100 nm (S13), the layer thickness adjustment conditions setting unit 45 sets the layer thickness adjustment conditions B so that substrates having an SOI layer thickness mean value of less than 100 nm are finished to an optimum layer thickness (S15). After S14 or S15, the production process proceeds to a layer thickness adjustment surface treatment step (S16).

Figure 14:
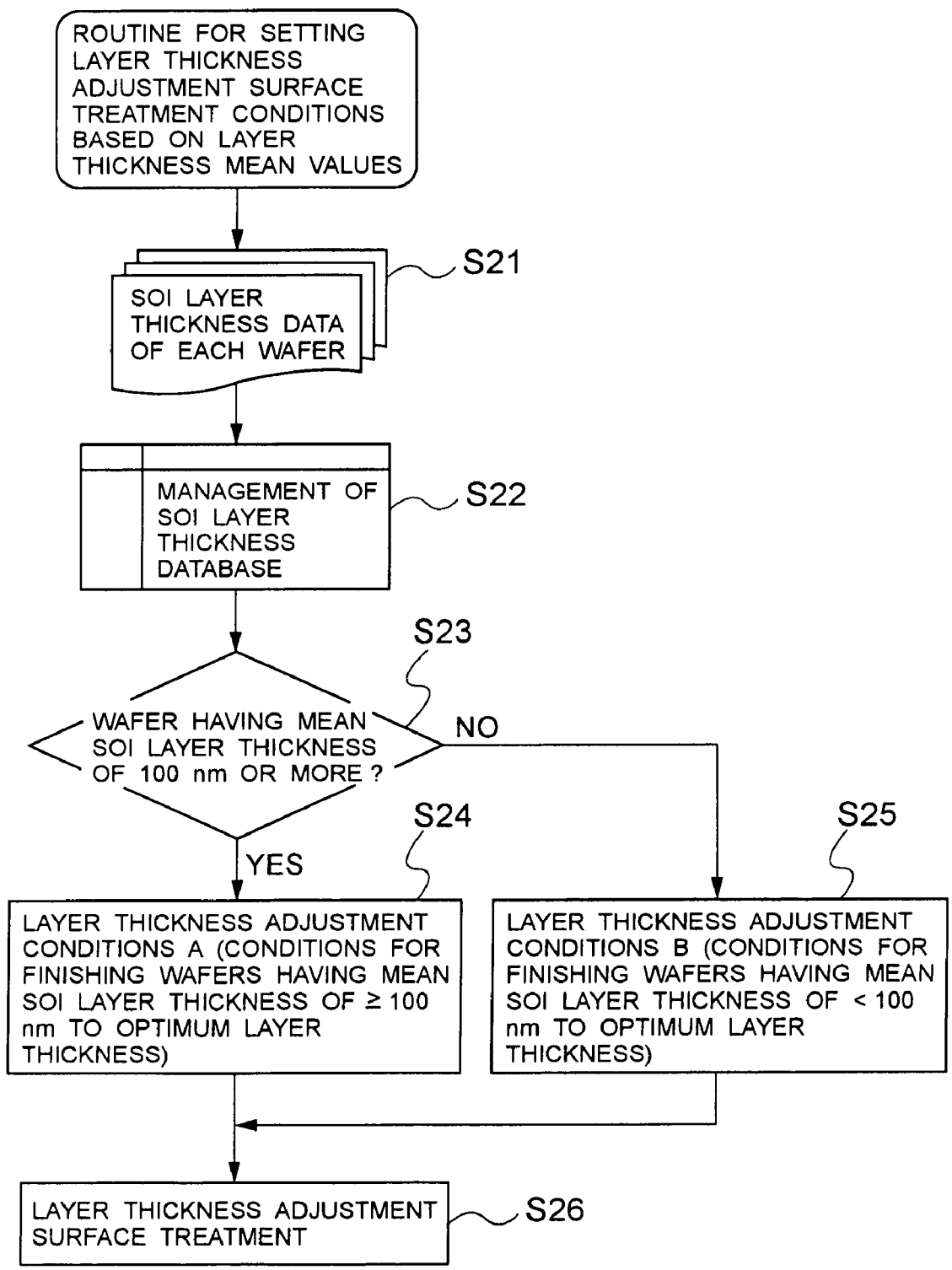
FIG. 14 is a flow chart showing a routine for setting layer thickness adjustment surface treatment conditions based on mean layer thickness.

FIG. 14 is a flow chart showing a routine for setting layer thickness adjustment surface treatment conditions based on layer thickness mean values. The processing until the SOI layer thickness database storage unit 42 stores the SOI layer thickness database is the same as that shown in FIG. 13. The substrate grouping unit 44 reads the SOI layer thicknesses from the SOI layer thickness database stored in the SOI layer thickness database storage unit 42, and groups the SOI substrates into a plurality of substrate groups based on the SOI layer thicknesses to create a substrate group table based on layer thickness mean values (S22). Once the substrate grouping unit 44 has created the substrate group table, the layer thickness adjustment conditions setting unit 45 reads the SOI layer thicknesses from the SOI layer thickness database stored in the SOI layer thickness database storage unit 42, and sets layer thickness adjustment surface treatment conditions for each substrate group based on the SOI layer thicknesses. If the SOI layer thickness mean value of the SOI substrate is 100 nm or more (S23), the layer thickness adjustment conditions setting unit 45 sets layer thickness adjustment conditions A so that substrates having an SOI layer thickness mean value of 100 nm or more are finished to an optimum layer thickness (S24). If the SOI layer thickness mean value of the SOI substrate is less than 100 nm (S23), the layer thickness adjustment conditions setting unit 45 sets the layer thickness adjustment conditions B so that substrates having an SOI layer thickness mean value of less than 100 nm are finished to an optimum layer thickness (S25). After S24 or S25, the production process proceeds to a layer thickness adjustment surface treatment step (S26).

Figure 15:
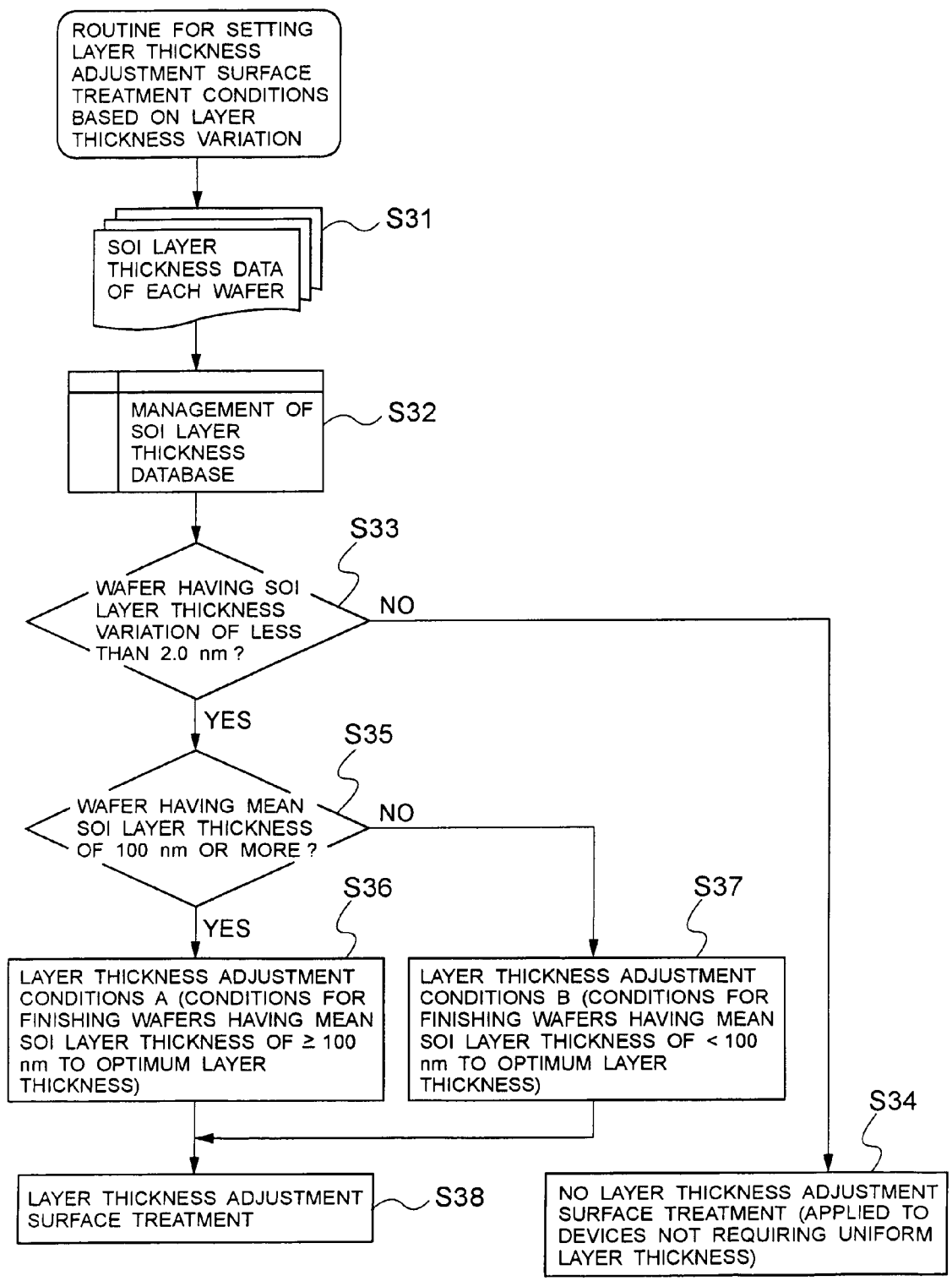
FIG. 15 is a flow chart showing a routine for setting layer thickness adjustment surface treatment conditions based on layer thickness variation.

FIG. 15 shows a routine for setting layer thickness adjustment surface treatment conditions based on layer thickness variation. Processing until the SOI layer thickness database storage unit 42 stores the SOI layer thickness database is the same as that shown in FIG. 13. The substrate grouping unit 44 reads the SOI layer thicknesses from the SOI layer thickness database stored in the SOI layer thickness database storage unit 42, and groups the SOI substrates into a plurality of substrate groups based on the SOI layer thicknesses to create a substrate group table based on layer thickness variation (S32). Once the substrate grouping unit 44 has created the substrate group table, the layer thickness adjustment conditions setting unit 45 reads the SOI layer thicknesses from the SOI layer thickness database stored in the SOI layer thickness database storage unit 42, and sets layer thickness adjustment surface treatment conditions for each substrate group based on the SOI layer thicknesses. If the variation in SOI layer thickness within the SOI substrate is 2 nm or more (S33), the layer thickness units 34-0 to 34-n do not carry out layer thickness adjustment surface treatment on that SOI substrate (S34). This SOI substrate is applied to a device that does not require layer thickness uniformity. If the SOI layer thickness variation is less than 2 nm and the SOI layer thickness mean value of the SOI substrate is 100 nm or more (S35), for example, then the layer thickness adjustment conditions setting unit 45 sets the layer thickness adjustment conditions A so that substrates having an SOI layer thickness mean value of 100 nm or more are finished to an optimum layer thickness (S36). If the SOI layer thickness variation is less than 2 nm and the SOI layer thickness mean value of the SOI substrate is less than 100 nm (S35), then the layer thickness adjustment conditions setting unit 45 sets the layer thickness adjustment conditions B so that substrates having an SOI layer thickness mean value of less than 100 nm are finished to an optimum layer thickness (S37). After S36 or S37, the production process proceeds to a layer thickness adjustment surface treatment step (S38).

The layer thickness adjustment conditions setting unit 45 supplies the layer thickness adjustment surface treatment conditions to the surface treatment unit 46. The surface treatment unit 46 sets treatment conditions such as temperature, time and atmospheric conditions based on the layer thickness adjustment surface treatment conditions. Once the surface treatment unit 46 has finished setting the treatment conditions, the substrate transport unit 33 supplies the SOI substrates, which are sorted by the substrate sorting unit 32, to the surface treatment unit 46 for each substrate group.

In the surface treatment step (S3), the layer thickness adjustment surface treatment is carried out for each substrate group G1, G2 and G3 under the layer thickness adjustment surface treatment conditions set for each substrate group G1, G2 and G3. The surface treatment unit 46 adjusts the thickness of the SOI layers by carrying out the layer thickness adjustment surface treatment on the SOI layers based on the layer thickness adjustment surface treatment conditions.

Figure 16:
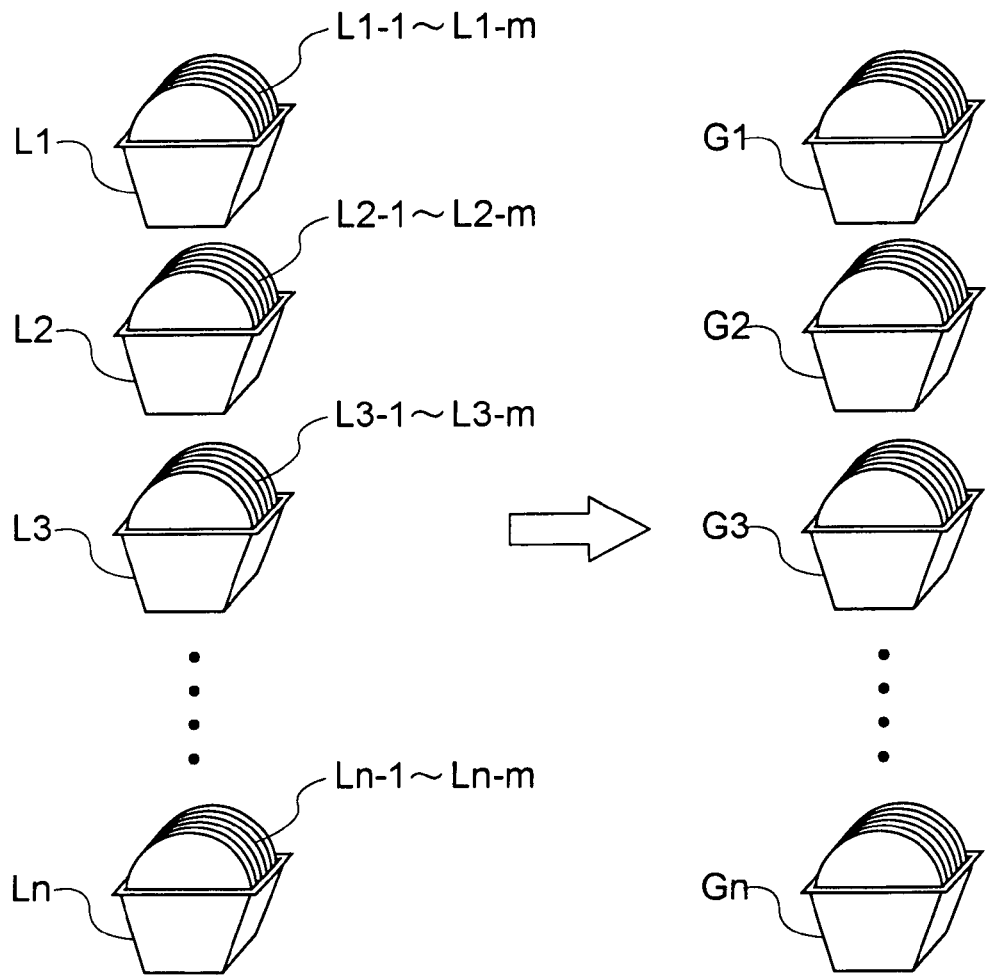
FIG. 16 illustrates production lots at the time of delivery and SOI substrate groups following sorting.

FIG. 16 depicts production lots at the time of delivery and substrate groups after sorting. The SOI substrates L1-1 to L1-m, L2-1 to L2-m, . . . and Ln-1 to Ln-m, which have not been sorted based on SOI layer thickness, are stored in the substrate storage unit 30 for respective production lots L1 to Ln at the time of delivery. In the surface treatment step, the substrate sorting unit 32 sorts the SOI substrates L1-1 to Ln-m into the substrate groups G1, G2, . . . and Gn based on the substrate group table created by the substrate grouping unit 44. For example, if the substrate grouping unit 44 has created a group table based on the layer thickness mean values, the substrate sorting unit 32 sorts the SOI substrates L1-1, L1-2 and L3-3 into the substrate group G1, the SOI substrates L1-3, L3-1 and L3-2 into the substrate group G2, and the SOI substrates L2-1, L2-2 and L2-3 into the substrate, group G3. In this manner, the substrate sorting unit 32 finishes the sorting of the substrate groups G1 to Gn.

In this step, the substrate transport unit 33 transports the substrate group G1 to the layer thickness adjustment unit 34-0, transports the substrate group G2 to the layer thickness adjustment unit 34-2, . . . and finally transports the substrate group Gn to the layer thickness adjustment unit 34-n. Once the layer thickness adjustment units 34-0 to 34-n have received the respective substrate groups from the substrate transport unit 33, the surface treatment unit 46 carries out the layer thickness adjustment surface treatment on the SOI layers contained in a substrate group under the layer thickness adjustment surface treatment conditions received from the layer thickness adjustment conditions setting unit 45. The surface treatment unit 46 simultaneously carries out the layer thickness adjustment surface treatment on the SOI layers contained in each of the received substrate groups.

Figure 17:
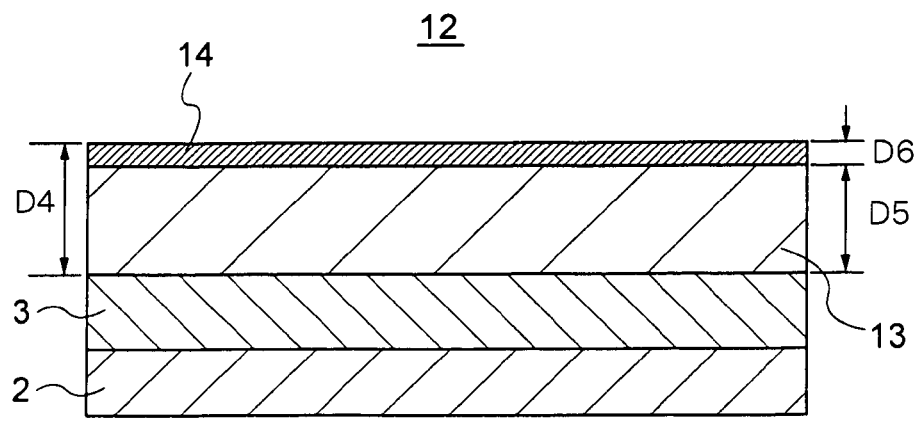
FIG. 17 is a cross-sectional view of an SOI substrate during SOI layer thickness adjustment surface treatment.

FIG. 17 is a cross-sectional view of an SOI substrate during the SOI layer thickness adjustment surface treatment. The oxide film 3 is formed on the silicon substrate 2. The SOI layer 13 having the SOI layer thickness D4 is formed on the buried oxide film 3. An example of the layer thickness adjustment surface treatment is layer thickness adjustment oxidation treatment that includes oxidation and etching treatment on the surface of the SOI layer. During the layer thickness adjustment oxidation treatment, the surface treatment unit 46 first converts the surface of the SOI layer 13 to a sacrificial oxide film 14 by carrying out oxidation treatment on the surface of the SOI layer 13. The sacrificial oxide film 14 has a sacrificial oxide film thickness D6. Subsequently, the surface treatment unit 46 removes the sacrificial oxide film 14 by carrying out etching treatment on the sacrificial oxide film 14 to form the SOI layer 13 having an SOI layer thickness D5.

As described above, the delivered SOI substrates are sorted into a plurality of groups based on the tendency of the SOI layer thickness D4 (i.e., based on the production lot mean values, layer thickness mean values or layer thickness variations), and the layer thickness adjustment oxidation treatment is carried out under layer thickness adjustment oxidation conditions set for each of such substrate groups. Therefore, the sacrificial oxide film thickness D6 can be adjusted, (changed) for each substrate group, and variations in the SOI layer thickness D5 of the SOI substrates can be reduced.

The substrate transport unit 35 transports SOI substrates, that have undergone layer thickness adjustment surface treatment by the respective layer thickness adjustment units 34-0 to 34-n, to the semiconductor circuit forming unit 36.

Finally, a semiconductor integrated circuit is formed on the SOI layer in a semiconductor integrated circuit formation step (S4). The semiconductor circuit forming unit 36 forms semiconductor integrated circuits on the SOI substrates by a process such as ordinary photolithography or ion implantation. Since variations in SOI layer thickness of the SOI substrates are reduced in the surface treatment step, the semiconductor circuit forming unit 36 is able to produce SOI semiconductor integrated circuits of uniform characteristics and quality in the semiconductor integrated circuit forming step.

As described in the foregoing, the present embodiment groups the SOI substrates based on SOI layer thickness of each SOI substrate upon delivery, decides the layer thickness adjustment surface treatment conditions for each of the substrate groups, and carries out the layer thickness adjustment surface treatment on each substrate group based on the layer thickness adjustment surface treatment conditions. Therefore, variations in SOI layer thickness among the SOI substrates are reduced at the initial stage of semiconductor integrated circuit production, thereby allowing the production of SOI semiconductor integrated circuits of uniform characteristics and quality.

The lot control device disclosed in Japanese Patent Application Kokai No. H5-73578 divides the SOI substrates into a plurality of lot units irregardless of SOI layer thickness, and semiconductor integrated circuits are produced en bloc in the divided lot units. Therefore, FD-SOI of uniform quality are unable to be produced. The lot compilation method and device disclosed in Japanese Patent Application Kokai No. H4-239152 recompile the lots based on identification numbers imparted in advance, irregardless of SOI layer thickness, to the substrates, and manufacture semiconductor integrated circuits en bloc in lot units following the recompilation. Therefore, FD-SOI of uniform quality are unable to be produced. The present invention clearly differs from Japanese Patent Application Kokai No. H5-73578 and Japanese Patent Application Kokai No. H4-239152 in that SOI substrates are grouped based on measured values of the SOI layer thicknesses. As a result of grouping a plurality of SOI substrates based on measured values of SOI layer thickness, setting layer thickness adjustment surface treatment conditions for each substrate group, and carrying out layer thickness adjustment surface treatment for each group as in the above-described embodiment of the present invention, variations in SOI layer thickness of the SOI substrates are reduced, thereby achieving the production of SOI semiconductor integrated circuits of uniform characteristics and quality.

In the example shown in Japanese Patent Application Kokai No. H7-302826, actual implantation depth is inspected following implantation of impurities into a source and drain, and gate length is altered based on the actual implantation depth and a predetermined equation. The present invention clearly differs from Japanese Patent Application Kokai No. H7-302826 in that layer thickness adjustment surface treatment conditions are set based on measured values of SOI layer thickness of each SOI substrate at the time of SOI substrate delivery. Since a source and drain are formed in an SOI layer of FD-SOI, it is impossible to produce FD-SOI of uniform quality if actual implantation depth of the source and drain should be inspected, as in Japanese Patent Application Kokai No. H7-302826, and if there are variations in SOI layer thickness among the SOI substrates. The setting of layer thickness adjustment surface treatment conditions based on measured values (measured values of SOI layer thickness of SOI substrates) at the initial stage (upon delivery) of semiconductor integrated circuit production as in the present embodiment constrains variance in the SOI layer thickness of the SOI substrates and allows the production of SOI semiconductor integrated circuits of uniform characteristics and quality.

Optically scannable, unique identification codes (so-called wafer markings) are respectively imparted to the workpieces (wafers), and groups of workpieces are respectively compiled into lots based on preset conditions using the identification codes in Japanese Patent Application Kokai No. H4-239152. The present invention differs from Japanese Patent Application Kokai No. H4-239152 in that wafer markings are not imparted to wafers (substrates), and wafers are sorted based on SOI layer thickness upon delivery. Japanese Patent Application Kokai No. H7-302826 differs from the present invention in that there is no concept of sorting a plurality of objects (SOI substrates in the present embodiment) based on a plurality of measured values (SOI layer thickness in the present embodiment), nor is there a concept of SOI substrates and SOI layer thickness. Consequently, Japanese Patent Application Kokai No. H4-239152 and Japanese Patent Application Kokai No. H7-302826 clearly differ from the present invention, and the effects of the present invention cannot be demonstrated even if Japanese Patent Application Kokai No. H4-239152 and Japanese Patent Application Kokai No. H7-302826 are combined.

Although processing conditions of a next step are set based on the processing results in a certain step in the system of Japanese Patent Application Kokai No. S63-249328, FD-SOI of uniform quality cannot be produced in the case there are variations in SOI layer thickness among a plurality of SOI substrates processed en bloc since the SOI substrates are normally processed en bloc in each step of the production of FD-SOI. The present invention differs from Japanese Patent Application Kokai No. S63-249328 in that SOI substrates are grouped based on measured values of SOI layer thickness of SOI substrates upon delivery, and layer thickness adjustment surface treatment conditions are set for each substrate group. By grouping SOI substrates based on measured values of SOI layer thickness, setting layer thickness adjustment surface treatment conditions for each substrate group, and processing a plurality of SOI substrates contained in each substrate group en bloc, only then it is possible to reduce variations in SOI layer thickness of the SOI substrates and enable the production of SOI semiconductor integrated circuits of uniform characteristics and quality.

The apparatus for manufacturing a semiconductor integrated circuit includes a layer thickness adjustment unit. This layer thickness adjustment unit has an SOI layer thickness database storage unit for storing an SOI layer thickness database. The layer thickness adjustment unit also has a layer thickness adjustment conditions setting unit (or controller) for extracting measured data for each SOI substrate from the SOI layer thickness database and setting conditions of the layer thickness adjustment surface treatment based on that data. The layer thickness adjustment unit also has a surface treatment unit for adjusting layer thickness of an SOI layer by carrying out surface treatment on an SOI layer in accordance with the conditions. Therefore, variations in SOI layer thickness of the SOI substrates can be reduced, thereby allowing the production of SOI semiconductor integrated circuits of uniform characteristics and quality.

This application is based on Japanese Patent Application No. 2007-72481 filed on Mar. 20, 2007 and the entire disclosure thereof is incorporated herein by reference.

What is claimed is:

1. A semiconductor integrated circuit production method comprising:
   an SOI substrate preparation step for preparing a plurality of SOI substrates, each said SOI substrate having an SOI layer on a surface thereof, each said SOI layer having a thickness;
   a layer thickness adjustment step for adjusting the thicknesses of the SOI layers by carrying out a layer thickness adjustment surface treatment on the SOI layers; and a semiconductor integrated circuit formation step for forming semiconductor integrated circuits on the SOI layers following the layer thickness adjustment step, wherein the layer thickness adjustment step includes:

an SOI layer thickness database generation step for generating an SOI layer thickness database that correlates identification data for each said SOI substrate with measurement data of the thickness of each said SOI layer, and a surface treatment step for extracting the measurement data for each said SOI substrate from the SOI layer thickness database and carrying out the layer thickness adjustment surface treatment on the SOI substrates according to treatment conditions decided based on the extracted measurement data, wherein the surface treatment step further includes a step of grouping the SOI substrates having mutual similarities in the measurement data, the step of grouping including a step of sorting the SOI substrates by the measurement data with respect to the mutual similarities, and the layer thickness adjustment surface treatment is simultaneously carried out on the SOI substrates belonging to a same group.

2. The semiconductor integrated circuit production method according to claim 1, wherein the layer thickness adjustment step includes a measurement step for measuring the thickness of the SOI layer for each said SOI substrate and using the same as said measurement data.

3. The semiconductor integrated circuit production method according to claim 1, wherein the layer thickness adjustment step includes a data acquisition step for using layer thickness data supplied together with the SOI substrates as the measurement data.

4. The semiconductor integrated circuit production method according to claim 1, wherein each said SOI substrate is a fully depleted SOI substrate, and each said SOI layer is a fully depleted SOI layer.

5. The semiconductor integrated circuit production method according to claim 1, wherein the layer thickness adjustment surface treatment includes oxidation of the SOI layer to from a sacrificial oxide film and etching of the sacrificial oxide film.

6. A semiconductor integrated circuit production device comprising:

a substrate storage unit for housing a plurality of SOI substrates, each said SOI substrate having an SOI layer on a surface thereof, each said SOI layer having a thickness;

a layer thickness adjustment unit for taking the SOI substrates from the substrate storage unit and adjusting the thicknesses of the SOI layers by layer thickness adjustment surface treatment; and a semiconductor integrated circuit formation unit for forming a semiconductor integrated circuit on each said SOI layer following the layer thickness adjustment, wherein the layer thickness adjustment unit includes:

an SOI layer thickness database storage unit for storing an SOI layer thickness database that correlates identification data for each said SOI substrate with measurement data of the thickness of the SOI layer of each said SOI substrate;

a layer thickness adjustment conditions control unit for extracting measurement data for each said SOI substrate from the SOI layer thickness database and setting conditions of the layer thickness adjustment surface treatment based on the extracted data; and a surface treatment unit for adjusting the layer thicknesses of the SOI layers by carrying out the layer thickness adjustment surface treatment on the SOI layers in accordance with the set conditions, wherein the layer thickness adjustment conditions control unit includes a substrate grouping unit for grouping the SOI substrates having mutual similarities in the measurement data, and sets the conditions of the layer thickness adjustment surface treatment for each SOI substrate group, the substrate grouping unit includes a substrate sorting unit for sorting the SOI substrates by the measurement data with respect to the mutual similarities, and the surface treatment unit adjusts the layer thicknesses by simultaneously carrying out the layer thickness adjustment surface treatment on the SOI substrates belonging to a same group.

7. The semiconductor integrated circuit production device according to claim 6, wherein each said SOI substrate is a fully depleted SOI substrate, and each said SOI layer is a fully depleted SOI layer.

8. The semiconductor integrated circuit production device according to claim 6, wherein the layer thickness adjustment surface treatment includes oxidation of the SOI layer to form a sacrificial oxide film and etching of the sacrificial oxide film.

9. The semiconductor integrated circuit production method according to claim 1, wherein the mutual similarities include an average thickness of the SOI layer for the SOI substrates of each lot.

10. The semiconductor integrated circuit production method according to claim 1, wherein the mutual similarities include an average thickness of the SOI layer for the SOI substrates of all lots.

11. The semiconductor integrated circuit production method according to claim 1, wherein the mutual similarities include an irregularity in the thickness of the SOI layer for the SOI substrates.

12. The semiconductor integrated circuit production device according to claim 6, wherein the mutual similarities include an average thickness of the SOI layer for the SOI substrates of each lot.

13. The semiconductor integrated circuit production device according to claim 6, wherein the mutual similarities include an average thickness of the SOI layer for the SOI substrates of all lots.

14. The semiconductor integrated circuit production device according to claim 6, wherein the mutual similarities include an irregularity in the thickness of the SOI layer for the SOI substrates.

* * * * *